United States Patent
Yu et al.

(10) Patent No.: US 8,403,436 B2
(45) Date of Patent: Mar. 26, 2013

(54) SLIDE RAIL ASSEMBLY

(75) Inventors: Mo-Ming Yu, Shenzhen (CN); Ze-Hong Chen, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 65 days.

(21) Appl. No.: 13/033,550

(22) Filed: Feb. 23, 2011

(65) Prior Publication Data

US 2012/0163740 A1    Jun. 28, 2012

(30) Foreign Application Priority Data

Dec. 24, 2010    (CN) .......................... 2010 1 0604456

(51) Int. Cl.
*A47B 88/04*    (2006.01)
(52) U.S. Cl. .................... 312/334.47; 312/333
(58) Field of Classification Search ............... 312/319.1, 312/333, 334.44, 334.46, 334.47, 334.7, 312/334.8, 334.1, 334.4; 384/21
See application file for complete search history.

(56) References Cited

U.S. PATENT DOCUMENTS

| | | | |
|---|---|---|---|
| 6,997,611 B2 * | 2/2006 | Chen et al. | 384/21 |
| 7,101,081 B2 * | 9/2006 | Chen et al. | 384/21 |
| 7,413,269 B2 * | 8/2008 | Chen et al. | 312/333 |
| 7,654,624 B2 * | 2/2010 | Huang et al. | 312/333 |
| 7,744,174 B2 * | 6/2010 | Peng et al. | 312/333 |
| 2003/0178922 A1 * | 9/2003 | Chen et al. | 312/334.44 |
| 2007/0164644 A1 * | 7/2007 | Hwang et al. | 312/333 |
| 2008/0018214 A1 * | 1/2008 | Huang | 312/334.46 |
| 2008/0034662 A1 * | 2/2008 | Peng et al. | 49/175 |
| 2008/0129170 A1 * | 6/2008 | Peng et al. | 312/334.44 |
| 2008/0141496 A1 * | 6/2008 | Peng et al. | 16/94 R |
| 2008/0150409 A1 * | 6/2008 | Huang et al. | 312/334.46 |
| 2008/0159670 A1 * | 7/2008 | Huang et al. | 384/18 |
| 2008/0191593 A1 * | 8/2008 | Huang et al. | 312/334.1 |
| 2008/0315741 A1 * | 12/2008 | Huang et al. | 312/334.7 |
| 2009/0310894 A1 * | 12/2009 | Yu et al. | 384/21 |
| 2011/0262060 A1 * | 10/2011 | Yu et al. | 384/21 |

* cited by examiner

*Primary Examiner* — James O Hansen
*Assistant Examiner* — Hiwot Tefera
(74) *Attorney, Agent, or Firm* — Altis Law Group, Inc.

(57) ABSTRACT

A slide rail assembly includes an outer rail, an intermediate rail, an inner rail, and a latch member pivotably mounted to the intermediate rail. The outer rail includes a support bar and a holding portion. The inner rail includes a stop portion. The latch member includes a first lock tongue and a second lock tongue. When the support bar supports the first lock tongue of the latch member to keep the latch member at a locking position, the second lock tongue of the latch member abuts against the stop portion, to enable the intermediate rail to slide in synchronization with the inner rail. When the latch member slides along the support bar to engage with the holding portion of the outer rail, the latch member is biased to pivot to an unlocking position, the second lock tongue of the latch member disengages from the stop portion.

7 Claims, 4 Drawing Sheets

SLIDE RAIL ASSEMBLY

BACKGROUND

1. Technical Field

The present disclosure relates to a slide rail assembly.

2. Description of Related Art

Slide rail assemblies are used in a rackable server system for slidably mounting server units to a server rack.

Each slide rail assembly includes an outer rail fixed to the server rack, an inner slide rail fixed to one server unit, and an intermediate slide rail arranged between the outer and inner slide rails. The intermediate slide rail is extendable relative to the outer slide rail, and the inner slide rail is extendable relative to the intermediate slide rail, thus the server unit can be extended a distance out from the server rack. Considerations of strength and smoothness of operation may render a given order or sequence preferable in a given slide configuration.

BRIEF DESCRIPTION OF THE DRAWINGS

Many aspects of the present embodiments can be better understood with reference to the following drawing. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION OF THE DESCRIPTION

Figure 1:
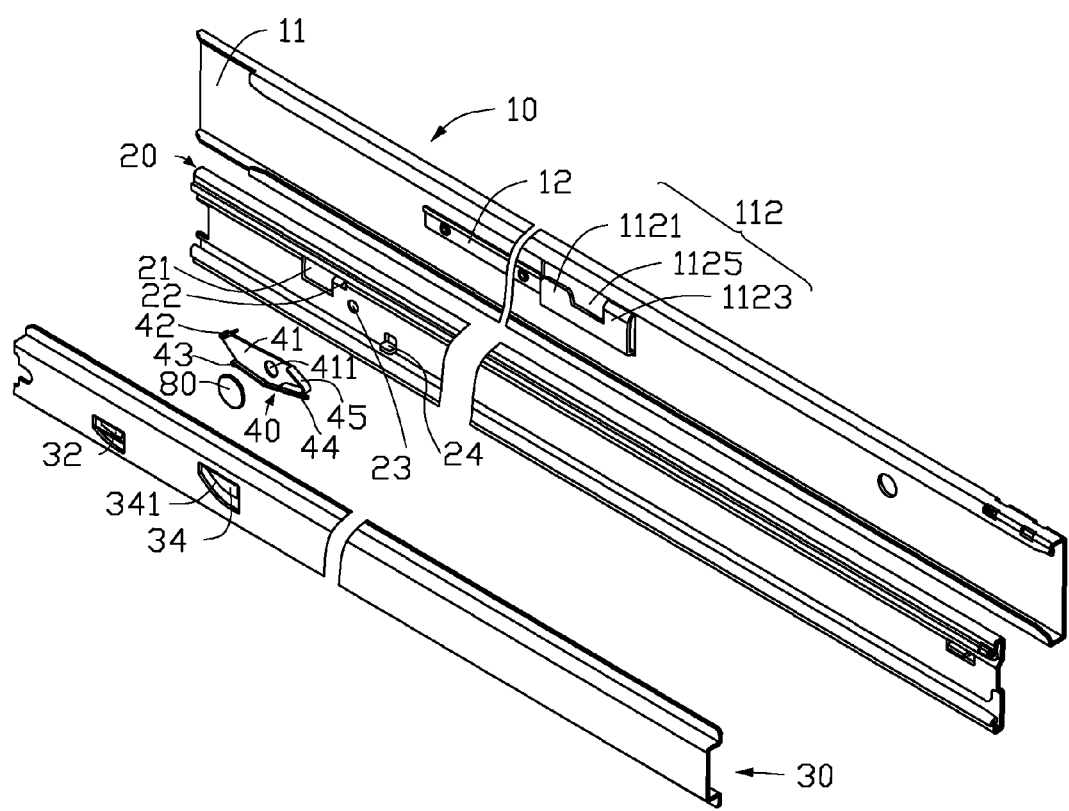
FIG. 1 is an exploded, isometric view of an embodiment of a slide rail assembly.

Referring to FIG. 1, an embodiment of a slide rail assembly includes an outer rail 10, an intermediate rail 20 slidably coupled to the outer rail 10, an inner rail 30 slidably coupled to the intermediate rail 20, and a latch member 40.

The outer rail 10 includes an elongated rail body 11, and a support bar 12 fixed to the rail body 11. The rail body 11 defines a substantially C-shaped cross section, and includes a sidewall (not labeled) and two flanges (not labeled) extending from opposite sides of the sidewall. A substantially U-shaped holding portion 112 protrudes from an inner side of the sidewall of the rail body 11. The holding portion 112 includes a first abutting block 1121 and a second abutting block 1123 at opposite ends of the holding portion 112, with a positioning slot 1125 defined between the first abutting block 1121 and the second abutting block 1123. In one embodiment, the support bar 12 is riveted to the rail body 11, and extends along a lengthwise direction of the rail body 11. A top side of the support bar 12 is flush with the first abutting block 1121 of the holding portion 112.

The intermediate rail 20 defines a substantially C-shaped cross section, and includes a sidewall (not labeled) and two flanges (not labeled) extending from opposite sides of the sidewall. The sidewall of the intermediate rail 20 defines a window 21 adjacent to a rear end of the intermediate rail 20, and a fastening hole 23 in front of the window 21. A retaining portion 22 protrudes outwards toward the outer rail 10 from the sidewall of the intermediate rail 20, and is arranged between the window 21 and the fastening hole 23. A tab 24 protrudes inwards from the sidewall of the intermediate rail 20, and is arranged in front of and adjacent to the fastening hole 23.

The inner rail 30 includes a sidewall (not labeled) and two flanges (not labeled) extending from opposite sides of the sidewall. A stop portion 32 and a releasing portion 34 protrude outwards towards the outer rail 10 from the sidewall of the inner rail 30, and adjacent to a rear end of the inner rail 30. The releasing portion 34 is arranged in front of the stop portion 32, and forms a cam surface 341 facing the stop portion 32.

The latch member 40 includes a main body 41 defining a pivot hole 411, a first lock tongue 42 protrudes outwards from a rear end of the main body 41, a second lock tongue 43 protruding inwards from a bottom of the main body 41, a resilient arm 44 extending from a front end of the second lock tongue 43, and a driving portion 45 protruding inwards from a front end of the main body 41.

Figure 2:
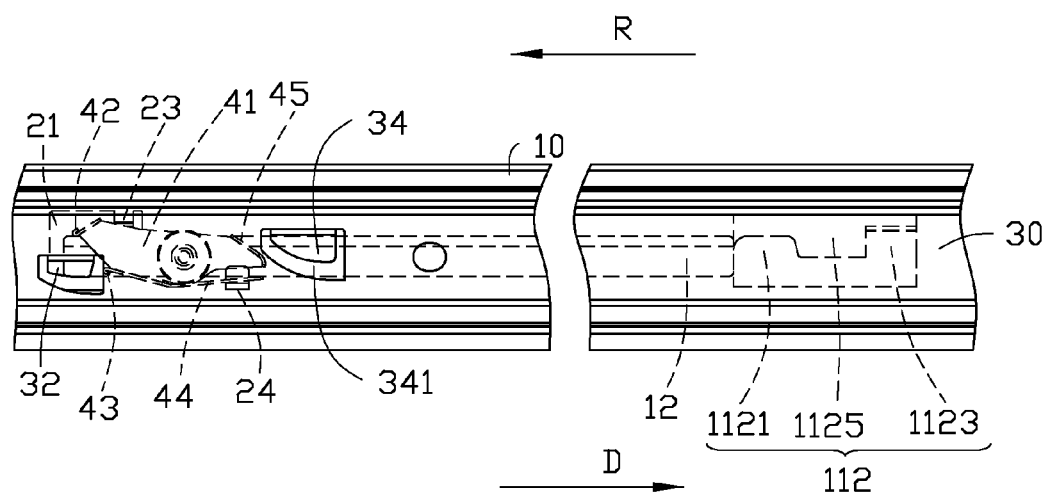
FIGS. 2-4 are assembled, side plan views of FIG. 1 in different use states.

Referring to FIGS. 1 and 2, in assembly, a pivoting pin 80 is rotatably extended through the pivot hole 411 of the latch member 40, and fastened in the fastening hole 23 of the intermediate rail 20, to pivotably mount the latch member 40 to the intermediate rail 20. The main body 41 of the latch member 40 abuts against an inner side of the intermediate rail 20. The first lock tongue 42 of the latch member 40 extends through the window 21 of the intermediate rail 20. The resilient arm 44 of the latch member 40 resists against the tab 24 of the intermediate rail 20. The inner rail 30 is slid into the intermediate rail 20, with the latch member 40 located in front of the stop portion 32. The intermediate rail 20 is slid into the outer rail 10. At the same time, the first lock tongue 42 of the latch member 40 is supported on the top of the support bar 12. Therefore, the latch member 40 is pivoted to be kept at a locking position, when the second lock tongue 43 is aligned with the stop portion 32 of the inner rail 30, and the tab 24 of the intermediate rail 20 deforms the resilient arm 44. In assembly of the slide rail assembly, the first lock tongue 42, the second lock tongue 43, and the driving portion 45 of the latch member 40 are slantingly oriented relative to sliding directions of the slide assembly indicated by arrows D or R of the slide assembly.

Figure 3:
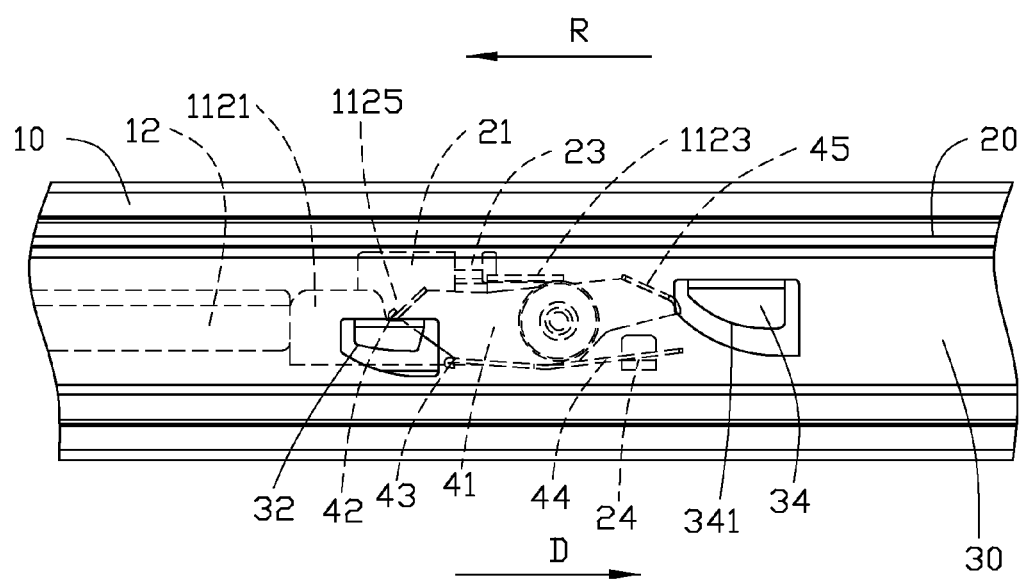

Referring to FIGS. 2 and 3, when the inner rail 30 is drawn forward in a direction indicated by arrow D, the stop portion 32 of the inner rail 30 abuts against the second lock tongue 43 of the latch member 40 after the inner rail 30 slides forward relative to the intermediate rail a slight distance. Therefore, the intermediate rail 20 slides forward in synchronization with the inner rail 30. The first lock tongue 42 is slid along the support bar 12 towards the holding portion 112, until the first lock tongue 42 is aligned with the positioning slot 1125 of the holding portion 112. In addition, the retaining portion 22 of the intermediate rail 20 abuts against the second abutting block 1123 to stop the intermediate rail 20 from sliding forward. The resilient arm 44 of the latch member 40 is restored to pivot the latch member 40 anticlockwise to an unlocking position when the first lock tongue 42 engages in the positioning slot 1125 of the holding portion 112 to stop the intermediate rail 20 from sliding rearwards in a direction indicated by arrow R. The second lock tongue 42 disengages from the stop portion 32 of the inner rail 30 to enable the inner rail 30 to slide forward relative to the intermediate rail 20 to be fully extended out of the intermediate rail 20.

Figure 4:
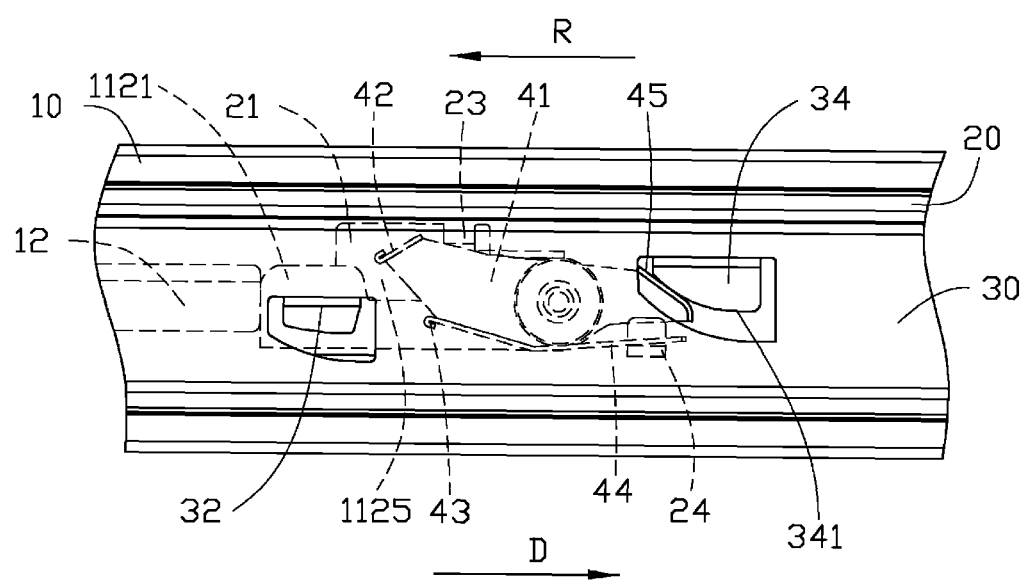

Referring to FIG. 4, when the inner rail 30 is driven rearwards in a direction indicated by arrow R. The intermediate rail 20 is stopped from sliding rearward with the inner rail 30 due to the engagement between the first lock tongue 42 and the positioning slot 1125 of the holding portion 112 of the outer rail 10, until the releasing portion 34 of the inner rail 30 engages with the driving portion 45 of the latch member 40. With the sliding of the inner rail 30, the driving portion 45 of the latch member 40 slides along the cam surface 341 of the releasing portion 34 of the inner rail 30 to make the latch member 40 pivot clockwise to the locking position. The first lock tongue 42 disengages from the positioning slot 1125 of the holding portion 112 of the outer rail 10 to enable the intermediate rail 20 to slide rearwards relative to the outer rail 10. At the same time, a stopping mechanism (not shown) of the intermediate rail 20 abuts against the inner rail 30. Therefore, the intermediate rail 20 slides rearward in synchronization with the inner rail 30 to be received into the outer rail 10.

It is to be understood, however, that even though numerous characteristics and advantages of the present disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A slide rail assembly comprising:
   an outer rail comprising an elongated rail body forming a holding portion, and a support bar fixed to the rail body and extending along a lengthwise direction of the rail body, the holding portion being adjacent to a front end of the support bar;
   an intermediate rail slidably coupled to the outer rail;
   an inner rail slidably coupled to the intermediate rail, and forming a stop portion; and
   a latch member pivotably mounted to the intermediate rail, and comprising a first lock tongue extending towards the outer rail, and a second lock tongue extending towards the inner rail;
   wherein the support bar of the outer rail supports the first lock tongue of the latch member to keep the latch member to a locking position, when the second lock tongue of the latch member abuts against the stop portion of the inner rail to enable the intermediate rail to slide forward in synchronization with the inner rail; the latch member is pivoted to an unlocking position, when the first lock tongue of the latch member is engaged with the holding portion in response to the first lock tongue sliding forward away from the support bar, and the second lock tongue of the latch member disengages from the stop portion of the inner rail to enable the inner rail slide forward relative to the intermediate rail; and the intermediate rail comprises a tab protruding towards the inner rail, the latch member further comprises a resilient arm resisting against the tab of the intermediate rail to be deformed in response to the latch member being at the locking position, thereby biasing the latch member towards the unlocking position.

2. The slide rail assembly of claim 1, wherein the latch member further comprises a main body arranged between the inner rail and the intermediate rail, and defines a pivot hole rotatably receiving a pivoting pin secured to the intermediate rail; the first lock tongue extends from a rear end the main body, extending through the intermediate rail; the second lock tongue extends from a bottom of the main body, and the resilient arm extends from a rear end of the second lock tongue.

3. The slide rail assembly of claim 2, wherein the latch member further comprises a driving portion protruding towards the inner rail from a front end of the main body, the inner rail further comprises a releasing portion to engage with the driving portion of the latch member and pivot the latch member towards the locking position in response to the inner rail sliding rearwards relative to the intermediate rail.

4. The slide rail assembly of claim 3, wherein the releasing portion of the inner rail is arranged in front of the stop portion of the inner rail, and forms a cam surface facing the stop portion, the driving portion is slantingly oriented relative to a sliding direction of the inner rail.

5. The slide rail assembly of claim 1, wherein the holding portion comprises a first abutting block and a second abutting block, and defines a positioning slot therein between the first abutting block and the second abutting block, the first lock tongue of the latch member is received in the positioning slot in response to the latch member being at the unlocking position.

6. The slide rail assembly of claim 5, wherein the first abutting block abuts against the front end of the support bar, and is flush with a top of the support bar.

7. The slide rail assembly of claim 6, wherein the intermediate rail comprises a retaining portion abutting against the second abutting block of the holding portion of the outer rail to prevent the intermediate rail from sliding relative to the outer rail, when the first lock tongue of the latch member slides over the support bar and is received in the positioning slot.

* * * * *